FREQUENCY COINCIDENCE DETECTOR

Filed March 20, 1967 4 Sheets-Sheet 1

INVENTOR.
JOHN G. NORDAHL
BY
Arnold, Roylance, Kruger & Durkee
ATTORNEYS

INVENTOR
JOHN G. NORDAHL
BY Arnold, Roylance, Kruger & Durkee
ATTORNEYS

INVENTOR
JOHN G. NORDAHL

BY Arnold, Roylance, Kruger & Durkee
ATTORNEYS

July 29, 1969 J. G. NORDAHL 3,458,823

FREQUENCY COINCIDENCE DETECTOR

Filed March 20, 1967 4 Sheets-Sheet 4

INVENTOR
JOHN G. NORDAHL

BY Arnold, Roylance, Kruger & Durkee
ATTORNEYS 3,458,823

FREQUENCY COINCIDENCE DETECTOR

John G. Nordahl, Lexington, Mass., assignor to Weston Instruments, Inc., Newark, N.J., a corporation of Delaware Filed Mar. 20, 1967, Ser. No. 624,353
Int. Cl. H03k *5/18*
U.S. Cl. 328—155 11 Claims

ABSTRACT OF THE DISCLOSURE

A phase-locked frequency coincidence control system is provided with a frequency difference detector to provide an initial synchronization signal to a voltage controlled oscillator. Two rectangular waveforms are simultaneously applied to a phase detector and to the frequency detector, the latter being prevented from operating unless the frequency difference is great. The frequency detector includes a monostable circuit which produces a short pulse at the beginning of each cycle of an input signal. The short pulse flips a first bistable circuit which enables a second bistable circuit. The next cycle of the oscillator signal flips the second bistable circuit to start a gate drive pulse and to generate a reset signal which resets the first bistable. The next cycle of the oscillator resets the second bistable and terminates the gate drive pulse. The gate drive switches a complementary switch, the output of which is averaged and compared with a reference in a differential integrating amplifier.

This invention relates to frequency coincidence detection apparatus and, more specifically to apparatus for comparing the frequencies of two electrical signals.

In U.S. patent application Ser. No. 622,573 filed Mar. 13, 1967, by Peter L. Richman and James L. West and assigned to a common assignee an apparatus is described for measuring the frequency of a low frequency signal. In the apparatus described in that application a phase-locked loop is used to synchronize two electrical signals as to phase, the apparatus also including a frequency divider to decrease the frequency of a higher frequency signal to that of a low frequency signal before comparison.

A disadvantage of the apparatus discussed above, and of phase-locked loops in general, is that an initial synchronization problem can arise if the two signals are initially significantly different. When the frequency of a reference input signal is substantially greater than or less than the frequency of an input signal which is to be compared to that reference, and, through the phase-locked loop, adjusted to match the reference, and when the two signals are applied to a phase detector, the error signal developed by the phase detector has an envelope which varies sinusoidally at a rate equal to the numerical difference between the two signal frequencies. In such apparatus this error signal is generally applied to an integrator or other averaging device to produce a DC control signal.

However, the long-term average of a sinusoid is zero. Thus, the frequency difference itself will produce no net correction signal and, if left alone, the apparatus will never enter its locked state of operation.

An object of the present invention is to provide apparatus for detecting a significant difference between the frequencies of two electrical signals.

Another object is to provide apparatus for developing an error signal when two electrical signals differ significantly in frequency, the error signal being capable of driving the frequency of one signal toward the frequency of the other.

A further object is to provide a frequency disparity detector especially useful in apparatus including a phase locked-loop for initially synchronizing the loop.

Yet another object is to provide frequency difference detecting apparatus which generates an error signal when two electrical signals differ from each other in frequency by an amount greater than a preselected amount but which generates no error signal when the frequency difference is less than the preselected amount.

A still further object is to provide phase detecting and frequency detecting apparatus especially useful in a phase locked-loop wherein the frequency detecting apparatus provides a corrective error signal for gross errors and the phase detecting apparatus provides a corrective error signal for small errors.

The apparatus of the invention includes means for developing a pulsating signal proportional to the frequency difference between first and second AC electrical signals and for filtering the signal to produce a DC error signal. Circuit means are provided for preventing the DC error signal from having any effect unless its magnitude exceeds a preselected level.

In a phase-locked loop, the frequency difference apparatus is used in conjunction with phase detector means which is effective to develop a unidirectional signal proportional to the phase difference between the two AC signals.

In order that the manner in which the foregoing and other objects are attained in accordance with the invention can be understood in detail, particularly advantageous embodiments thereof will be described with reference to the accompanying drawings, which form a part of this specification, and wherein.

Figure 1:
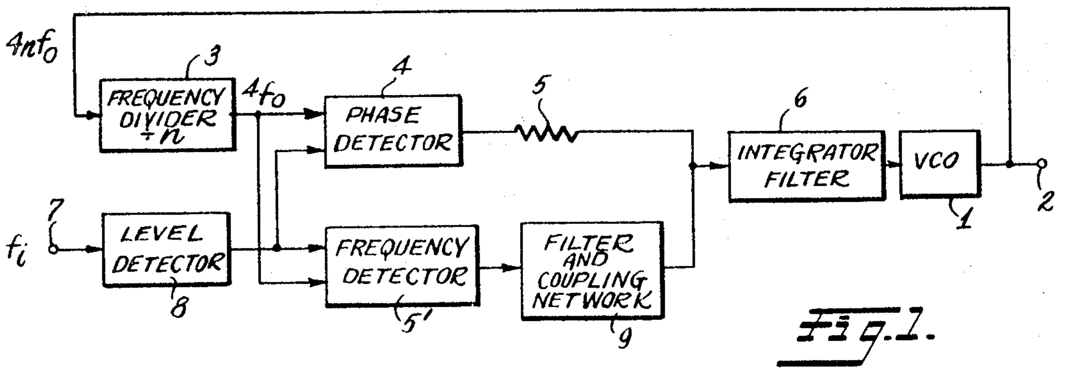
FIG. 1 is a schematic diagram showing one embodiment of a frequency control system in accordance with the invention.

A simplified block diagram of an apparatus in accordance with the present invention is shown in FIG. 1 wherein a voltage controlled oscillator 1 generates an electrical signal which appears at an output terminal 2 and which is connected to the input terminal of a frequency divider circuit 3. Oscillator 1 can be any conventional voltage controlled oscillator which is capable of producing signals having frequencies within a preselected range or band, the actual frequency of the signal developed being a function of a DC control voltage applied to a control terminal thereof. Oscillators of this type are well known and need not be described in detail herein. It will be recognized that oscillator 1 can also include range switching mechanisms by which the band of frequencies can be changed in major steps, this apparatus not being shown or described herein.

Divider circuit 3 divides the frequency of the signal produced by oscillator 1 by a preselected integral factor. It will be recognized that divider 3 is a conventional type of circuit and can be provided with apparatus to change the number by which the input frequency is divided. For convenience, the output of oscillator 1 will be referred to as $4nf_0$, $n$ being the integer by which the frequency is divided by divider circuit 3.

The output of divider 3 is connected to one input of a phase detector circuit 4 and also to one input of a frequency detector circuit 5'. The output of phase detector circuit 4 is connected to one terminal of a resistor 5, the other terminal of which is connected to the input of an integrator and filter circuit 6. The operation of the integrator/filter is to smooth the voltage produced by the phase detector circuit and to provide a DC control voltage to the control terminal of oscillator 1.

An input signal at a frequency $f_1$ is applied to an input terminal 7 which is connected to the input terminal of a level detector circuit 8. Detector circuit 8 is a conventional circuit which is capable of detecting the axis crossings of a signal applied to terminal 7 and of generating an output signal which is substantially rectangular in waveform and which is at the same frequency $f_1$. The output of detector circuit 8 is connected to another input terminal of phase detector 4 and also to the other input terminal of frequency detector 5. The output of frequency detector 5 is connected to a filter and coupling network 9 which produces a unidirectional voltage which is also applied to the input of integrator and filter circuit 6 and comprises part of the signal developed for the control terminal of oscillator 1.

It will be recognized that divider circuit 3, phase detector circuit 4, filter circuit 6 and oscillator 1 constitute an apparatus similar to that described in the previously mentioned application Ser. No. 622,573, by Richman and West, and also can incorporate the phase detector described in copending application Ser. No. 624,102, filed Mar. 17, 1967 by James L. West. This apparatus includes a phase locked loop wherein the two signals, $4nf_0$ and $f_1$ applied to the phase detector which generates a DC signal proportional to the phase difference, this DC signal constituting the input to an integrator/filter circuit which controls the frequency of a voltage controlled oscillator to bring the two signals into a predetermined relationship. It will be noted that the two signals need not be at the same frequency but that there must be a particular frequency, but that there must be a particular frequency relationship between the two signals. This is indicated by the designations $f_1$ and $4nf_0$. It will be assumed herein that $f_0$ and $f_1$ are ideally the same frequency, and that this ideal situation will be realized when the oscillator has been properly adjusted and the phase locked loop is fully synchronized. A major advantage of the phase detector described in the above copending applications is that a unidirectional voltage is produced when there is a phase disparity between the two incoming signals, and no signal is produced when the signals are exactly in phase. However, when the signals are of different frequencies, especially when this frequency difference is great, the output unidirectional voltage is modulated by a sinusoidally varying AC signal the average value of which is zero. The average value is determined by the integrator circuit which produces the DC signal for the oscillator, so that if the average value of the major signal is zero, the oscillator is not properly controlled and the frequency difference continues.

This difficulty of initial synchronization is avoided by the addition of frequency detector circuit 5 and filter and coupling network 9. The frequency detector generates a voltage which is representative of the difference in frequency between the signals applied thereto. It will be noted that the frequency detector is designed to generate an output voltage when $f_0$ is not equal to $f_1$. The multiplication factor of 4 in the output of divider circuit 3 is selected to improve the sensitivity and dynamic range of the apparatus, and can be viewed merely as a scaling factor having no meaning from the standpoint of the frequency detector output. Thus, if $4f_0$ is precisely four times $f_1$, the frequency detector will produce no output. The significance of this factor will be understood more easily in the following discussions. The filter and coupling network is inserted to smooth the output of the frequency detector, and also to provide a dead band, or threshold, operation. It will be recognized that if the frequencies of the two signals are in the desired relationship with the only adjustment being one of phase relationship, no signal from the frequency detecting portion of the apparatus is necessary. Thus, network 9 includes a circuit which prevents any output from the frequency detecting portion of the system unless the voltage from the integrator exceeds a preselected level, indicating a frequency difference of a magnitude significantly great to present a possible initial synchronization problem.

Figure 2:
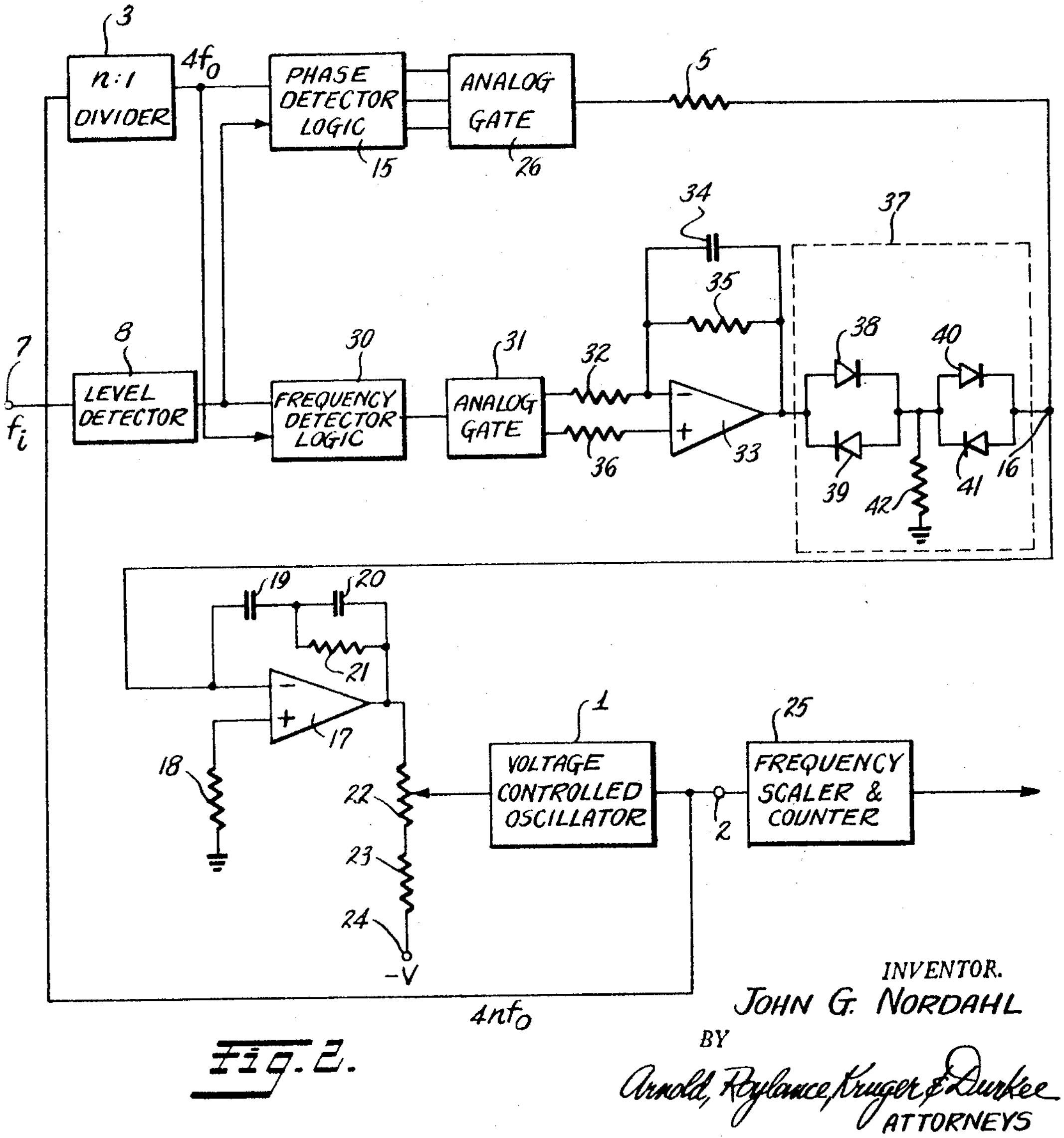
FIG. 2 is a schematic diagram of a second embodiment of a system of the type of FIG. 1.

An embodiment of the apparatus is shown in greater detail in FIG. 2, wherein the $4f_0$ signal is connected to the input terminal of logic circuits in a phase detector logic unit 15. The outputs of logic unit 15 are connected to an analog gate circuit 26 which provides a series of unidirectional signals only when a phase difference exists between the two input signals. The output of the analog gate is connected through resistor 5 to a junction 16 which is connected to one input terminal of a differential amplifier circuit 17. The other input terminal of differential amplifier 17 is connected through a fixed resistor 18 to a point of reference potential such as ground. A feedback circuit including a capacitor 19 and a capacitor 20, connected in series circuit relationship, is connected between the input and output terminals of amplifier 17. A fixed resistor 21 is connected in parallel circuit relationship with capacitor 20, the resistor-capacitor network comprising the feedback circuit being effective to produce an integrating amplifier having a preselected integrating factor meeting the necessary stability criteria. The output of the integrator is connected to one terminal of the resistance portion of a potentiometer 22, the other terminal of which is connected via a fixed resistor 23 to a negative DC supply terminal 24. The movable wiper of potentiometer 22 is connected to the control input terminal of voltage controlled oscillator 1. As in FIG. 1, the output of oscillator 1 is connected to the input of divider circuit 3, and also to an output terminal.

FIG. 2 also shows a utilization device 25 which can include any suitable apparatus such as a frequency measuring or counting device, and which can also include scaling apparatus to divide the finally generated frequency as desired. Unit 25 can also provide an output signal to other utilization equipment.

The frequency detecting portion of the system includes frequency detecting logic circuit means 30 which produces a gate signal to an analog gate circuit 31. Gate circuit 31 is designed to produce a signal which can exist at either of two voltage levels, normally either ground or a preselected voltage of one polarity. One output of gate circuit 31 is connected via a fixed resistor 32 to one input terminal of a differential amplifier 33. Gate circuit 31 also includes apparatus for producing a reference voltage level which is connected to the other terminal of differential amplifier 33. A capacitor 34 is connected in parallel circuit relationship with a fixed resistor 35 between the input and output terminals of amplifier 32 to produce an integrating differential amplifier. The output of amplifier 33 is connected to one terminal of a dead band or threshold circuit 37 which includes conventional semiconductor diodes 38, 39, 40 and 41, and a fixed resistor 42. Diodes 38 and 39 are connected in parallel circuit relationship and are poled in opposite directions, one end of the parallel circuit being connected to the output of amplifier 33 and the other terminal being connected to one terminal of fixed resistor 42 and one terminal of a similar parallel circuit including diodes 40 and 41. Resistor 42 is connected between the midpoint of circuit 37 and ground, and the other end of the parallel circuit including diodes 40 and 41 is connected to junction 16.

The operation of the apparatus of FIG. 2 will be considered by first assuming that the signal generated by oscillator 1 is not at the desired integral multiple of the signal applied to input terminal 7, that is, that $f_1$ is substantially different from $f_0$. Under these circumstances, the phase detector 40 of the apparatus will develop an error signal, but this signal will be ineffective to accomplish initial synchronization of the system. The signal at frequency $f_1$ is applied to level detector circuit 8 which senses the axis crossing of $f_1$ and produces an output signal at frequency $f_1$ having a rectangular waveform. Divider circuit 3 divides the $4nf_0$ signal produced by oscillator 1 by a factor *n*, producing a signal $4f_0$ also having a rectangular waveform. These two waveforms are applied to the frequency detector logic circuit 30 which generates an output signal which gates the analog gate circuit 31 to produce an output signal which switches between two DC levels, for example, ground and six volts. This output signal is coupled by resistor 32 to differential amplifier 33. A reference voltage is coupled by resistor 36 to the other input terminal of amplifier 33.

The output signal from gate circuit 31 is not normally a symmetrically switched signal. When $f_0$ equals $f_1$, this output is characterized by a greater length of time at the six-volt level than at the ground level, thereby producing a net signal which has an average value closer to six volts than to ground. The reference level provided through resistor 36 can be some intermediate value between ground and six volts, for example, 4.5 volts. In the assumed circumstances of a relatively large frequency difference between $f_0$ and $f_1$, the error signal voltage provided by the analog gate through resistor 32 will have an average value greater than 4.5 volts. Thus, the differential amplifier 33 produces an output signal proportional to the difference between these two voltages and couples that signal to dead band circuit 37. When the signal becomes great enough to overcome the voltage drop characteristic of the conventional diodes in circuit 37, an output will appear at junction 16 and at one input terminal of amplifier 17. The integrator including amplifier 17 integrates this error signal and provides a smooth DC control signal to the control terminal of oscillator 1, causing the frequency produced by the oscillator to change in the direction of $4nf_1$.

It will be recognized that the ultimate error signal produced by the frequency detecting portion of the apparatus can be either positive or negative depending upon the direction of the frequency difference. Thus, if $f_0$ is substantially greater than $f_1$, the signal produced by gate circuit 31 will spend substantially more time at the six-volt level than at the zero level as described in the above circumstances. However, if $f_0$ is much less than $f_1$, the error voltage to the input of the integrator circuit including amplifier 33 spends more time at the zero level so that the average value is less than the 4.5 reference level and the differential amplifier produces a negative signal for delivery to dead band circuit 37 and, if sufficiently great in absolute magnitude, to junction 16. As the frequency of oscillator 1 moves closer to $4nf_1$, the voltage at junction 16 approaches zero. When that voltage reaches the critical level determined by the dead band circuit, that portion of the error signal at junction 16 which is due to the action of the frequency detecting portion of the circuit will completely disappear, the only remaining error signal being that developed by the phase detector circuit which completes the process of refining the frequency adjustment of oscillator 1. As discussed in the previously mentioned copending applications, the phase detector apparatus produces a unidirectional voltage, either positive or negative, when a phase difference exists, the polarity of the signal being a function of the direction of the phase difference and the average value of the error signal being proportional to the amount of phase difference. This signal also goes to zero when phase and frequency synchronization is reached.

Figure 3:
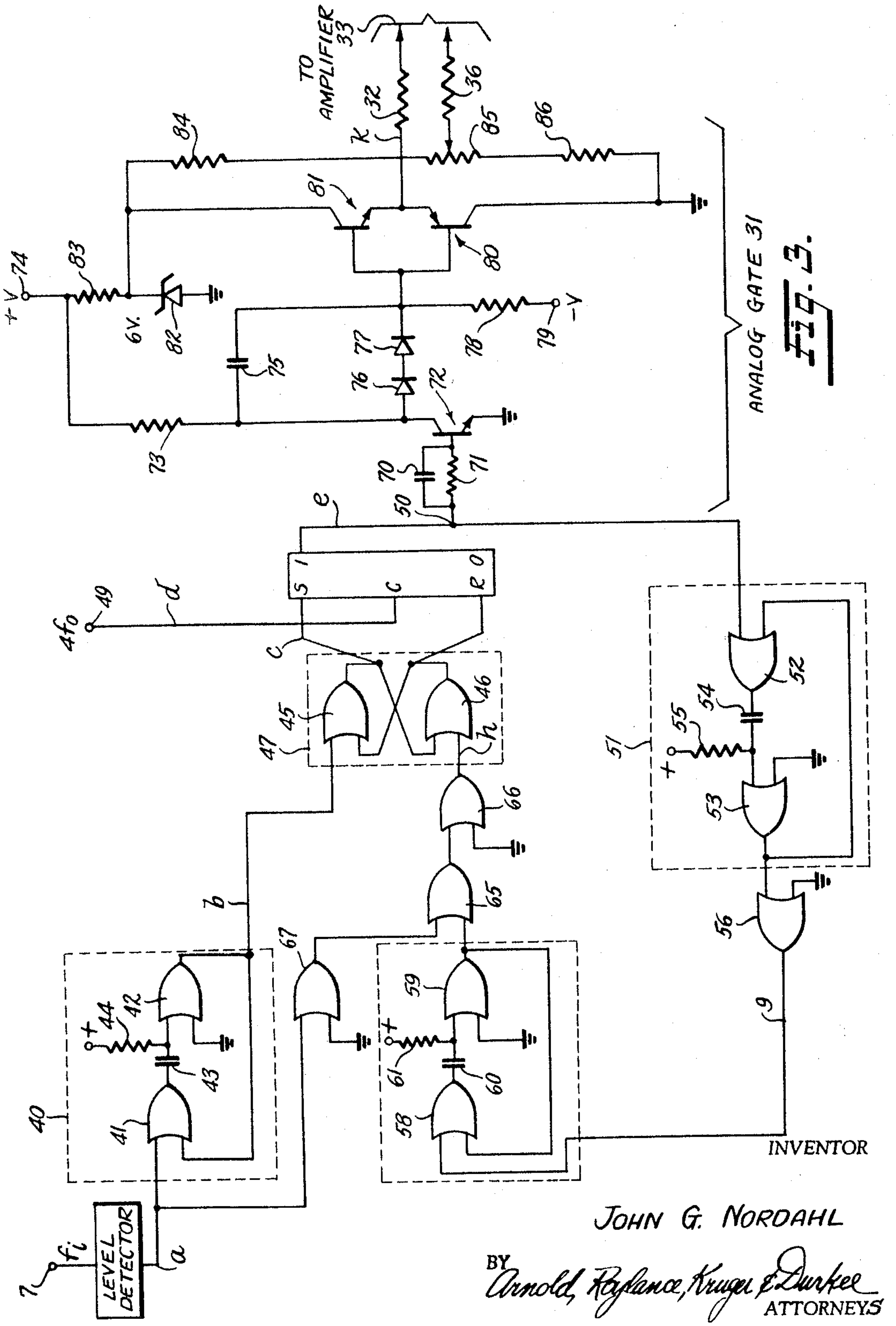
FIG. 3 is a detailed schematic diagram of a frequency difference detector according to the concepts of the invention.
Figure 4:
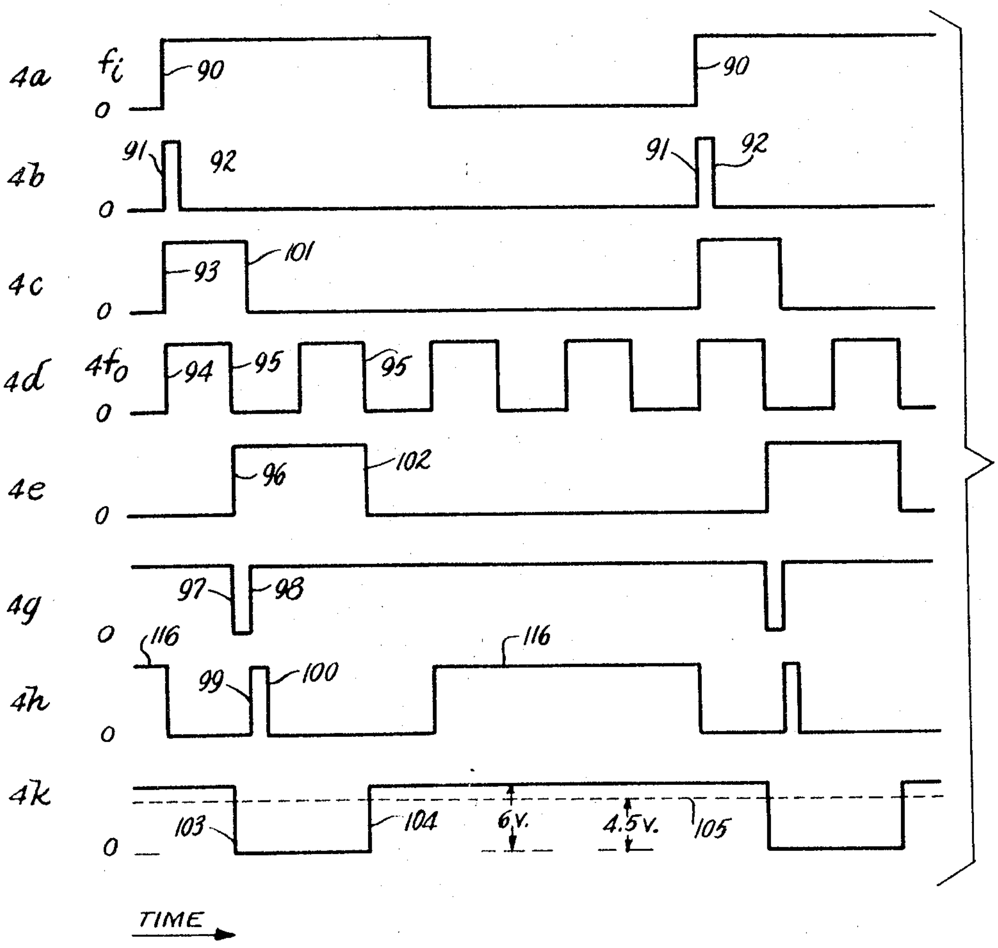
FIGS. 4 and 5 are waveform diagrams showing the time relationships of signals which can occur in the apparatus of FIGS. 1–3.
Figure 5:
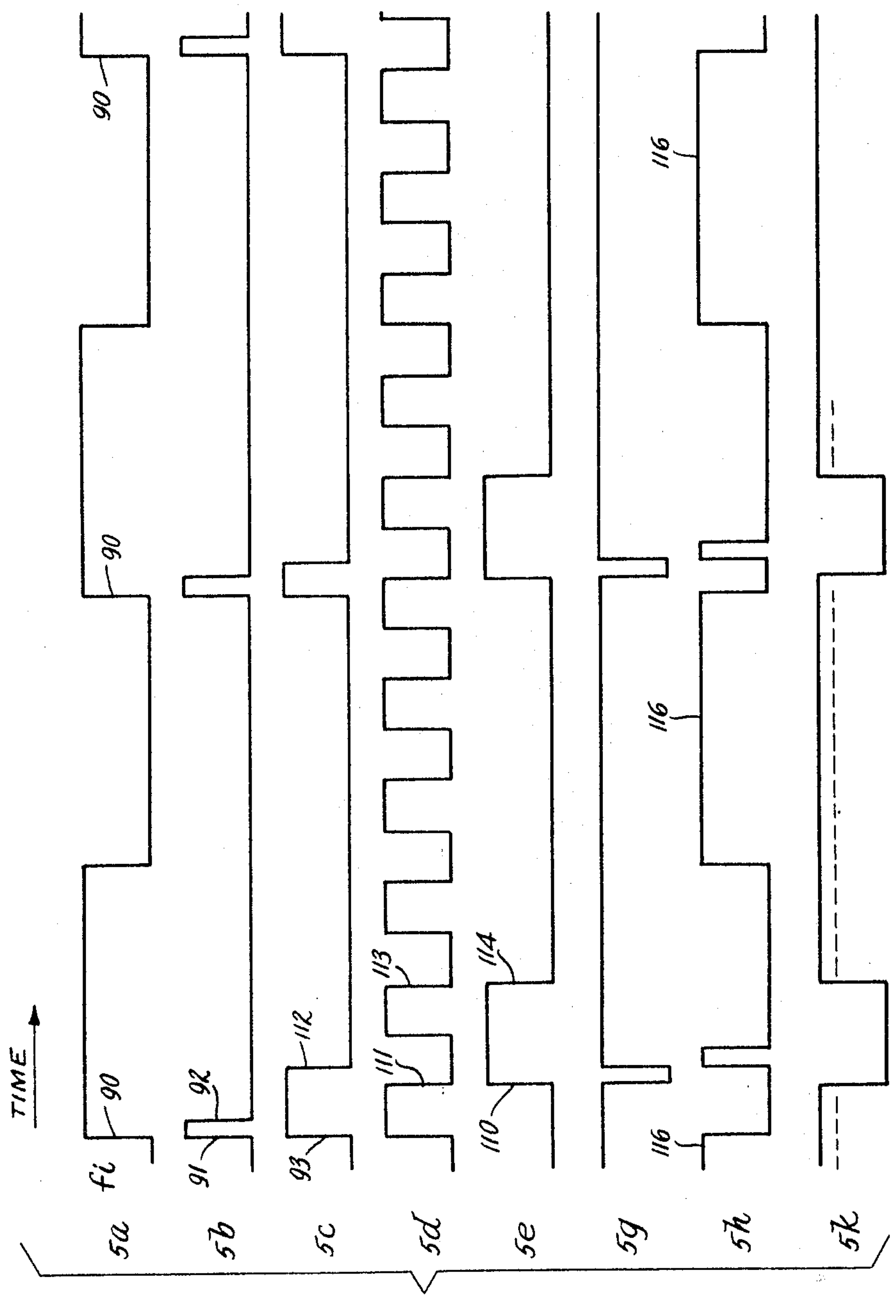

FIG. 3 shows in greater detail an embodiment of the frequency detecting portion of the apparatus including the logic circuits and the gating circuit usable in the apparatus of FIGS. 1 and 2. The operation of the apparatus of FIG. 3 will be described with reference to the wave forms in FIGS. 4 and 5, individual waveforms in which are identified by small letters *a–k*. These letters identify varies points in the circuit of FIG. 3 at which these waveforms occur under two frequency relationship situations. It will be helpful to recognize at this point that FIG. 4 illustrates the situation wherein $f_0=f_1$, while the circuit of FIG. 5 illustrates a situation wherein $f_0$ is significantly greater tnan $f_1$.

Figure 6:
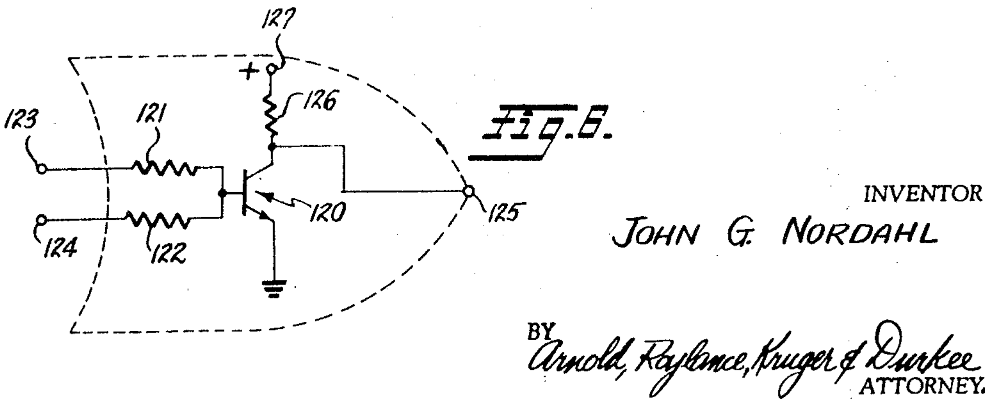
FIG. 6 is a schematic diagram of a logic circuit of the type usable in the apparatus of FIG. 3.

In FIG. 3 $f_1$ is applied to input terminal 7 which is connected through level detector circuit 8 to the input of a one shot, or monostable, circuit 40 which includes two logic circuits of the type known as OR circuits or inverted circuits and which are identified by the numerals 41 and 42. Many of these circuits are used in the apparatus of FIG. 3, each being of the type which produces a "0" output level when a positive or "1" input level appears at either of the two input terminals. One example of an OR circuit of this type is shown in FIG. 6, wherein the base electrode of a conventional NPN switching transistor indicated generally at 120 is connected to one terminal of both of fixed resistors 121 and 122. The other terminals of resistors 121 and 122 are connected to input terminals 123 and 124, respectively. The emitter electrode of transistor 120 is connected to ground. The collector electrode is connected to an output terminal 125 and, through a fixed resistor 126, to a DC supply terminal 127.

With no signals applied to either of terminals 123 or 124, those terminals rest at ground level and transistor 120 is nonconductive. The collector electrode and output terminal 125 are therefore at the voltage level of terminal 127. However, if a positive signal is applied to either or both of terminals 123 or 124, the transistor becomes conductive, dropping the potential of the collector electrode an dterminal 125 to nearly ground potential. The circuit therefore performs an OR function as shown by the following truth table:

| | | | | |
|---|---|---|---|---|
| terminal 123 | 0 | 0 | 1 | 1 |
| terminal 124 | 0 | 1 | 0 | 1 |
| terminal 125 | 1 | 0 | 0 | 0 |

Also, if a positive-going pulse is applied to either input terminal a negative-going pulse appears at the output. The circuit of FIG. 6 can therefore be regarded as a pulse inverter circuit.

Returning now to the discussion of FIG. 3, it will be seen that the $f_1$ signal is applied to one input terminal of OR circuit 41, the output terminal of which is connected to one terminal of a fixed capacitor 43. The other terminal of capacitor 43 is connected to one input terminal of OR circuit 42 which is also connected to a fixed resistor 44 to a positive DC supply. The other input terminal of OR circuit 42 constitutes the output terminal of monostable circuit 40, and is also connected to the other input terminal of OR circuit 41.

The output of monostable circuit 40 is connected to one input terminal of an OR circuit 45 which is interconnected with an OR circuit 46 to form a bistable circuit 47. The output of OR circuit 45 is connected to the RESET input terminal of a bistable, or flip-flop, circuit 48, and is also connected to one input of OR circuit 46. The output of OR circuit 46 is connected to the SET input terminal of bistable circuit 48 and also to the other input terminal of OR circuit 45. The switch or complement input terminal of bistable circuit 48 is connected to a terminal 49 which is connected to the $4f_0$ source which can be the output of divider circuit 3 of FIGS. 1 or 2.

Bistable circuit 48 is a conventional device having two stable states and two output terminals designated as a "1" output terminal and a "0" output terminal. The particular type of bistable circuit usable in this device is known as a JK flip-flop circuit which requires an input to the complement input terminal and to one of the SET or RESET input terminals in order to change state. In the circuit of FIG. 3 the output is taken from the "1"

output terminal. Thus, a "1" output signal appears when signals are, or have been, concurrently applied to the complement and set terminals. The "1" output level falls to zero when a "1" signal is applied to the RESET input terminal and the input to the COMPLEMENT terminal is at the "0" level.

The output of bistable circuit 48 is connected to a junction 50 which constitutes the input to analog gate circuit 31. Terminal 50 is also connected to the input of a one shot or monostable circuit 51 which includes OR circuit 51 which includes OR circuits 52 and 53 and also a fixed capacitor 54 and a fixed resistor 55. These elements are connected in the same manner as the elements in monostable circuit 40, and need not be redescribed. The output of monostable circuit 51 is connected to one input terminal of an OR circuit 56, the other input terminal of which is connected to ground. The output of OR circuit 56 is connected to the input terminal of a monstable circuit 57 which includes OR circuits 58 and 59, a fixed capacitor 60 and a fixed resistor 61. The elements of monostable circuit 57 are connected as in circuits 40 and 51. The output of monostable circuit 57 is connected to one input of an OR circuit 65, the output of which is connected to an OR circuit 66. The output of OR circuit 66 is connected to the previously unmentioned input terminal of OR circuit 46.

Input terminal 7 is also connected to one input terminal of an OR circuit 67, the other input terminal of which is connected to ground and the output terminal of which is connected to the other input terminal of OR circuit 65.

The analog gate circuit includes a fixed capacitor 70 and a fixed resistor 71 connected in parallel circuit relationship between junction 50 and the base electrode of a conventional NPN transistor indicated generally at 72. The emitter electrode of transistor 72 is connected to ground, and the collector electrode is connected through a fixed resistor 73 to a positive DC supply terminal 74. The collector electrode of transistor 72 is also connected to one terminal of a fixed capacitor 75 and to one terminal of a series circuit including two semiconductor diodes 76 and 77 which are connected in series circuit relationship with each other, poled in the same direction, and in parallel circuit relationship with capacitor 75. The other terminal of this parallel circuit is connected through a fixed resistor 78 to a negative DC supply terminal 79 and to the base electrodes of two conventional semiconductor transistors, one being a PNP type transistor indicated generally at 80 and the other being an NPN type transistor indicated generally at 81. The collector electrode of transistor 81 is connected to the cathode of a Zener diode 82, the anode of which is connected to ground, and also through a fixed resistor 83 to DC supply terminal 74. The collector electrode of transistor 80 is connected to ground. The emitter electrodes of transistors 80 and 81 are connected to each other and to one terminal of a resistor 32 which, as discussed in FIG. 2, couples the voltage appearing at the emitter electrodes of the two transistors to one input terminal of differential amplifier 33. A voltage divider including a fixed resistor 84, the resistance element of a potentiometer 85 and a fixed resistor 86, is connected between the cathode of Zener diode 82 and ground. The movable wiper of potentiometer 85 is connected to one terminal of resistor 36 the other terminal of which is also connected to amplifier 33.

It will be recognized that the voltage divider which includes potentiometer 85 establishes a reference voltage level at the movable wiper of the potentiometer and, hence, at one input terminal of differential amplifier 33. As will be recognized by one skilled in the art, Zener diode 82 establishes at its cathode, a fixed DC voltage determined by the characteristics of the diode, assuming that the DC voltage applied to course terminal 74 exceeds the rated voltage of the diode. The voltage level at the movable wiper of potentiometer 85 is then established at a level determined by the relative values of the resistances of 84, 85 and 86. Using the values previously selected for purposes of example, if resistor 84 is selected to have a value of 1,000 ohms, resistor 86 4,700 ohms and the resistance element of potentiometer 85 1,000 ohms, and if Zener diode 82 is selected to have a 6 volt regulation level, simple arithmetic will show that the movable wiper of potentiometer 85 can be adjusted to provide a 4.5 volt level at the reference input terminal of differential amplifier 53. The voltage coupled to amplifier 33 by resistor 32 can then be compared with that level.

The operation of the logical elements shown in FIG. 3 will first be discussed with reference to FIG. 4. Waveform **4*a* shows slightly more than one cycle of a signal at frequency $f_1$ applied to the input of OR circuit 41. It will be assumed that the level detector produces a rectangular waveform which switches between zero and some positive level to provide appropriate conditions for operation of the logical elements in FIG. 3 and that the waveform has a leading edge 90. With no signal applied to the input terminal of monostable circuit 40, the ungrounded input terminal of OR circuit 42 rests at a positive level because of the charge developed on capacitor 43 by current flow through resistor 44 from the positive DC supply. Thus the output terminal of OR circuit 42 and one input terminal of OR circuit 41 rest at ground level. The input terminal of OR circuit 41 connected to the level detector is also at ground level so that the output of OR circuit 41 is at the positive level established at the sources of supply. When leading edge 90 of the positive portion of waveform 4*a* is applied to OR circuit 41, the output of that OR circuit drops to zero level, temporarily discharging capacitor 43 and causing the output of OR circuit 42 to rise to its positive, or "1" output level. This is a substantially instantaneous effect, thereby producing at point B a positive-going wave 91 shown in FIG. 4*b*. Capacitor 43 is then recharged through resistor 44, causing the voltage at this input terminal of OR circuit 42 to rise again. When that voltage reaches the critical level determined by the circuit elements of OR circuit 42, that circuit returns to its previous state at which time the voltage at point B returns to the zero level, producing the trailing edge 92 of waveform 4*b***. The net result of this operation is to produce a pulse of relatively short duration and having a leading edge which is substantially coincident in time with the leading edge of the positive-going portion of input pulse $f_1$.

The **4*b* pulse is applied to one input terminal of OR circuit 45 in bistable circuit 47, causing that bistable circuit to change state. This change of state causes the output of OR circuit 46 to switch from zero to 1 condition, producing the leading edge 93 of a rectangular pulse seen in waveform 4*c*. This pulse is applied to the SET input terminal of bistable circuit 48**.

As seen in waveform **4*d*, the $4f_0$ signal, which is applied at terminal 49 and conducted to the complement input of bistable circuit 48, includes a series of rectangular pulses each having a leading edge 94 and a trailing edge 95. Waveform 4*e* shows that no output exists at the "1" output of bistable circuit 48, the voltage at that point being zero. However, the positive voltage applied to the SET input terminal (waveform 4*c*) enables the bistable circuit, the switching occurring when trailing edge 95 of the first $4f_0$ pulse is applied to the complement input, this combination causing bistable 48 to change state, producing a gate driving pulse having a leading edge 96. The positive-going leading edge 96 is applied to the analog gate circuit, and is also applied to the input terminal of monostable circuit 51 which operates in the manner described for monostable circuit 40, producing at the output of OR circuit 53 a relatively short duration positive-going pulse. This pulse is applied to OR circuit 56 wherein it is inverted to produce a relatively short duration negative-going pulse shown in waveform 4***g*, the leading edge 97 of this pulse being coincident in time with the leading edge 96 of waveform 4*e*, and the trailing edge 98 being, in effect, a delayed positive-going wave. This delayed positive-going pulse is applied to the input terminal of monostable circuit 57 which produces a relatively short positive pulse which is twice inverted and then applied as a RESET signal to the RESET input terminal of bistable circuit 47. This pulse is shown in waveform 4*h*, the leading edge being 99 and the trailing edge 100. As will be seen, leading edge 99 causes bistable circuit 47 to switch back to its original state, producing trailing edge 101 of the pulse in waveform 4*c*.

With the RESET input to bistable circuit 48 at a positive DC level and the SET input at zero volts (waveform 4*c*), the next negative-going portion of the complement input, trailing edge 95 of the second pulse waveform 4*d*, causes bistable circuit 48 to return to its previous state producing trailing edge 102 of waveform 4*e*. Thus, the net result of the logic circuits between input terminal 7 and junction 50 is the production of a rectangular pulse as shown in waveform 4*e* having a leading edge 96 and a trailing edge 102, the time separation between the leading and trailing edges being a function of the time relationship between one cycle of the signal at frequency $f_i$ and several cycles of the signal at frequency $4f_o$, the actual number of these cycles involved being a function of the condition of synchronization of these two signals.

At this point it will be apparent that a multiple of four for the relationship between $f_i$ and $f_o$ is chosen to allow some flexibility in the synchronization in this logical circuitry. Other multiples can be used, and would undoubtedly be satisfactory for many purposes. For the particular circumstances shown, and for use in the apparatus of FIGS. 1 and 2, a factor of 4 has been found to be quite satisfactory.

Now turning to the operation of the analog gate circuit, it will be seen that the gate driving pulse shown in waveform 4*e* is coupled to the base of transistor 72 which is rendered conductive with the application of the positive pulse, the pulse being thereby conducted simultaneously to the base electrodes of transistors 80 and 81. Transistors 80 and 81 are connected to form a complementary switch, the transistors being alternately conductive depending upon the polarity of the signal applied to the base electrodes. If a positive DC level appears at the base electrodes, transistor 80 is maintained in a nonconductive state and transistor 81 is rendered conductive, providing a low impedance connection between the positive DC source and resistor 32 connected to amplifier 33. Conversely, a negative potential at the bases of transistors 80 and 81 renders transistor 80 conductive, connecting the input to amplifier 33 substantially to ground.

When the positive-going pulse shown in waveform 4*e* is applied to the base electrode of transistors 72 the base electrodes of transistors 80 and 81 are substantially at ground, causing the output voltage to amplifier 33 to drop to ground level, producing a negative going pulse shown in waveform 4*k*, the leading edge 103 and the trailing edge 104 being coincident in time with leading and trailing edges 96 and 102 of the positive-going pulse in waveform 4*e*. With the collector electrode of transistor 81 connected to the positive six volt supply regulated by Zener diode 82, the output voltage at the common connection of the emitter electrodes of transistors 80 and 81 switches between a six volt level and a ground level as shown in waveform 4*k*. The dotted line 105 in waveform 4*k* is included to illustrate the voltage reference level established by the adjustment of potentiometer 85 which in the example, is 4.5 volts. The switched voltage shown in waveform 4*k* is averaged by the integrating circuit including amplifier 33 in FIG. 2, this amplifier also being effective to amplify the difference between the average of the switched voltage and the 4.5 volt reference level. In the case illustrated by FIG. 4, wherein the $f_i$ and $f_o$ signals are in phase and of the same frequency, the average of the waveform in 4*k* is very close to 4.5 volts so that the output voltage from the differential amplifier is quite small and is completely blocked by dead band circuit 37, allowing any minor discrepancies in the frequency of the voltage controlled oscillator to be refined by the phase detector portion of the apparatus alone.

In FIG. 5 the situation is illustrated wherein $4f_o$ includes more pulses per unit time, i.e., a higher frequency, than is desired. As before, the leading edge 90 of waveform $f_i$ is applied to monostable circuit 40 and generates a relatively narrow pulse having a leading edge 91 and a trailing edge 92. This pulse is applied to bistable circuit 47 and produces a pulse having a leading edge 93, the presence of this pulse concurrently with the trailing edge of one positive pulse of $4f_o$ when applied to bistable circuit 48 being effective to generate the leading edge 110 of the gate drive pulse in waveform 5*e*. This signal is fed back through monostable circuit 51 to produce negative-going pulse 5*g* and RESET pulse 5*h*.

Thus far the waveforms produced are quite similar to those described with reference to FIG. 4 except that the trailing edge 111 of the $4f_o$ signal occurs earlier because of the higher frequency of $f_o$ and initiates leading edge 110 of the gate drive pulse earlier and also produces the RESET pulses culminating in the pulse in waveform 5*h* at an earlier time. Thus the pulse in 5*c* terminates earlier in trailing edge 112. Further, the trailing edge of the second positive pulse in waveform 5*d* terminates in trailing edge 113 at an earlier time, thus terminating the gate drive pulse in trailing edge 114 at an earlier time. As discussed with reference to FIG. 4, the output of the analog gate directly follows the gate drive pulse, except that the polarity is in the opposite direction. Thus when the duration of the gate drive pulse is decreased, the duration of the negative-going pulse from the analog gate is also diminished in duration. However, the succeeding gate drive pulse is not commenced any earlier because it is initiated by the $f_i$ signal. Thus the ratio of the time spent at the positive level to the time at the negative level of waveform 5*k* is increased as the frequency of the $4f_o$ signal is increased. This raises the average value of the waveform shown in 5*k* and, hence, the average value of the signal voltage applied to differential amplifier 33.

The shifting relationship in time can be seen by observing the change in pulse duration of the waveforms in 5*c*, the leading edge of these pulses being established by each leading edge 90 of the $f_i$ signal and the trailing edge being a delayed function of the trailing edge of the next $4f_o$ pulse. It will be seen that regardless of the shifting durations of these pulses each negative-going portion of the wave form shown in 5*k* is constant in duration for a given frequency relationship, but that the duration diminishes as the frequency difference increases.

The operation of OR circuit 67 and the related portion of waveform 4*h* and 5*h* have not yet been described. It will be recognized that under some time relationship bistable circuit 47 might not be properly reset and that the proper error signal can therefore not be developed. Inverter 67 is included to eliminate this possibility. The $f_i$ signal is inverted by inverter 67 and inserted in the reset loop by application to one terminal of OR circuit 65. The signal is then twice inverted and becomes a part of reset waveform 5*h* (or 4*h*), to make sure that the bistable circuit is in condition to receive the next 5*b* pulse. These initial condition pulses are identified as pulses 116 in FIGS. 4 and 5.

From the above discussion it will be apparent that the voltage developed in the output of the integrator including amplifier 33 is directly proportional to the ratio of the difference of the frequencies to the frequency of the voltage controlled oscillator, i.e., $$\frac{f_i - f_o}{f_o}$$

It will also be apparent as mentioned above, that other integers can be used as the multiplier for the voltage controlled oscillator, but that a fator of 4 provides reasonably good sensitivity. If a ratio of less than 4 is used, limitations arise on the range of frequency difference ratios which will still yield a proportion output. If ratios of greater than 4 are used the sentivity, or change in output voltage for a given frequency error, will be decreased.

While certain advantageous embodiments have been chosen to illustrate the invention it will be understood by those skilled in the art that various changes and modifications can be made therein without departing from the scope of the invention as defined in the appended claims.

What is claimed is:

1. Apparatus for comparing two electrical signals as to phase and frequency and for establishing a predetermined relationship between the signals, the apparatus comprising the combination of voltage controlled oscillator circuit means having a control terminal and an output terminal, for generating a first electrical signal at first frequency which lies within a preselected frequency band, said first frequency being variable within said band in accordance with the magnitude of DC control voltage applied to said control terminal; an input terminal to which a second electrical signal can be applied at a second frequency; shaping circuit means for rendering said first and second signals substantially rectangular; phase detector circuit means having two input terminals and an output terminal for accepting said first and second signals from said shaping circuit means and for providing at said output terminal a unidirectional voltage when a phase difference exists between said signals; frequency detector circuit means having two input terminals and an output terminal for accepting said first and second signals from said shaping circuit means and for providing at said output terminal a unidirectional voltage when the frequencies of said first and second signals differ from a predetermined numerical relationship; and means for summing and smoothing said unidirectional voltages produced by said phase and frequency detector circuit means and for providing the resulting voltage to said control terminal of said oscillator circuit means.

2. Apparatus according to claim 1 wherein said frequency detector circuit means comprises logic circuit means for accepting the electrical signal at said second frequency and for producing an electrical pulse having a leading edge which bears a predetermined time relationship to a cycle of said second signal; bistable circuit means connected to said logic circuit means and to the one of said input terminals to which said second electrical signal is applied, said bistable circuit means being responsive to the simultaneous occurrence of a pulse from said logic circuit means and one edge of a rectangular wave of said first electrical signal to change from one stable state to the other and to produce a control pulse the duration of which is related to the difference in the frequencies of said first and second signals from said predetermined relationship; and switch means responsive to said control pulse for connecting said output terminal of said frequency detector circuit means to one of two possible voltage reference levels.

3. Apparatus according to claim 1 wherein said frequency detector circuit means comprises logic circuit means responsive to said first and second signals in rectangular form for producing an electrical signal which is switched between two voltage levels so that the average value of the signal is proportional to the algebraic difference between the first and second frequencies divided by the first frequency; and means for averaging the signal produced by said logic circuit means to provide a DC voltage which varies with changes in the frequency difference.

4. Apparatus according to claim 3 wherein said logic circuit means comprises means for producing a single relatively short duration pulse representative of each cycle of said second frequency; bistable circuit means responsive to the presence of said single pulse and to a cycle of said first frequency to generate a gate pulse the duration of which is a function of the frequency difference between said first and second frequencies.

5. Apparatus according to claim 1 wherein said means for summing and smoothing said unidirectional voltages comprises threshold circuit means for preventing said smoothed unidirectional from reaching said control terminal of said oscillator circuit means unless said voltage exceeds a preselected threshold level.

6. Apparatus according to claim 1 wherein said frequency detector circuit means comprises output circuit means for providing at said output terminal a voltage which can exist at either of two DC levels; and means for controlling the level at said output terminal a voltage which can exist at either of two DC levels; and means for controlling the level at said output terminal comprising means for initiating a control pulse in response to a preselected portion of each cycle of said second electrical signal; and means for terminating said control pulse in response to the occurrence of a portion of a waveform of said first electrical signal; said output circuit means being responsive to said control pulse to hold the voltage at one DC level when said control pulse is present and at the other level when said control pulse is not present, the average value of the voltage at said output terminal being representative of the difference from the predetermined frequency relationship.

7. Apparatus for determining deviation of the frequencies of first and second electrical signals from a predetermined relationship comprising means for accepting the first electrical signal and for producing a pulse having a relatively short duration and bearing a predetermned time relationship to a cycle of the first signal; means responsive to said pulse for initialing a gate pulse; means for accepting the second signal and for terminating said gate pulse in response to a predetermined portion of a cycle of the second signal; means responsive to said gate pulse for generating a bilevel electrical signal the average value of which is a function of the duration of said gate pulse; and means for averaging said bilevel signal to provide a smoothly varying signal representative of the deviation of said first and second signals from a predetermined frequency relationship.

8. Frequency detection apparatus comprising first monostable circuit means for accepting a first AC electrical signal having a frequency $f_1$ and for producing a pulse bearing a predetermined time relationship to a cycle of said first signal; first bistable circuit means connected to said first monostable circuit means and responsive to each pulse produced thereby to change from one stable state to the other to imitate an enabling pulse; means for providing a series of recurrent pulses at a frequency $f_2$; second bistable circuit means for responding to the presence of said enabling pulse and to the concurrent existence of a preselected portion of a cycle of one of said recurrent pulses to change state and to initiate a gate pulse; means responsive to the initiation of said gate pulse to generate a reset pulse and to provide said reset pulse to said first bistable circuit means to return said first bistable circuit means to said one stable state and to thereby terminate said enabling pulse; said second bistable circuit means being responsive to the absence of said enabling pulse and the concurrent existence of a preselected portion of a subsequent one of said recurrent pulses to change state and to thereby terminate said gate pulse; output circuit means responsive to the time average of a plurality of said gate pulses to produce a signal indicative of the frequency relationship between said frequencies $f_1$ and $f_2$.

9. Apparatus according to claim 8 wherein said output circuit means comprises means for establishing first and second voltage reference levels; filter circuit means for accepting an alternating voltage signal and for producing a relatively smooth signal; and switch means for connecting the input of said filter circuit means to said first voltage reference level during the time occupied by each said gate pulse and for connecting the input of said filter circuit means to said second voltage reference level in the absence of a gate pulse.

10. Apparatus according to claim 9 wherein said output circuit means comprises means for establishing a third reference voltage level; and integrator circuit means in said filter circuit means for averaging the voltages connected to said filter circuit means by said switch means, for comparing said averaged voltage to said third reference voltage level and for amplifying any difference between the averaged and third reference levels.

11. Apparatus according to claim 8 wherein said output circuit means comprises threshold circuit means for blocking the signal indicative of the frequency relationship unless said signal exceeds a preselected threshold value.

References Cited

UNITED STATES PATENTS

| | | | |
|---|---|---|---|
| 2,896,074 | 7/1959 | Newsom et al. ---- | 328—141 X |
| 3,344,358 | 9/1967 | Riker ------------ | 328—155 X |
| 3,358,240 | 12/1967 | McKay ---------- | 328—155 X |

JOHN S. HEYMAN, Primary Examiner

U.S. Cl. X.R.

328—110, 141

Disclaimer and Dedication 3,458,823.—*John G. Nordahl*, Lexington, Mass. FREQUENCY COINCIDENCE DETECTOR. Patent dated July 29, 1969. Disclaimer and dedication filed Mar. 17, 1971, by the assignee, *Weston Instruments, Inc.*

Hereby enters this disclaimer to the remaining term of said patent and dedicates said patent to the Public.

[*Official Gazette April 27, 1971.*]